(12) United States Patent
Kawashima

(10) Patent No.: US 8,592,275 B2
(45) Date of Patent: Nov. 26, 2013

(54) SEMICONDUCTOR DEVICE AND PRODUCTION METHOD THEREOF

(71) Applicant: Renesas Electronics Corporation, Kawasaki (JP)

(72) Inventor: Yoshiyuki Kawashima, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/888,922

(22) Filed: May 7, 2013

(65) Prior Publication Data

US 2013/0244391 A1    Sep. 19, 2013

Related U.S. Application Data

(62) Division of application No. 12/787,151, filed on May 25, 2010, now Pat. No. 8,450,790.

(30) Foreign Application Priority Data

Jun. 2, 2009   (JP) .................................. 2009-132668

(51) Int. Cl.
   *H01L 21/8239*   (2006.01)

(52) U.S. Cl.
   USPC .................. 438/266; 438/267; 257/E21.422; 257/E21.423; 257/E21.679; 257/E21.68

(58) Field of Classification Search
   USPC ............ 257/314–327, 369, E29.3, E29.309, 257/E21.422, E21.423, E21.679–E21.694; 438/199–201, 211, 266, 267
   See application file for complete search history.

(56) References Cited

U.S. PATENT DOCUMENTS

| 7,235,441 B2 | 6/2007 | Yasui et al. |
| 7,339,231 B2 | 3/2008 | Katayama |
| 2004/0238878 A1 | 12/2004 | Sato et al. |
| 2006/0281262 A1 | 12/2006 | Hisamoto et al. |
| 2007/0228498 A1 | 10/2007 | Toba et al. |
| 2008/0151629 A1 | 6/2008 | Ito et al. |
| 2009/0001449 A1 | 1/2009 | Toba et al. |
| 2009/0050955 A1 | 2/2009 | Akita et al. |

FOREIGN PATENT DOCUMENTS

JP   2006-100531 A   4/2006

*Primary Examiner* — Steven J Fulk
*Assistant Examiner* — Eric Ward
(74) *Attorney, Agent, or Firm* — Miles & Stockbridge P.C.

(57) ABSTRACT

An object of the present invention is to provide a semiconductor device having a nonvolatile memory cell of a high operation speed and a high rewrite cycle and a nonvolatile memory cell of high reliability. In a split gate type nonvolatile memory in which memory gate electrodes are formed in the shape of sidewalls of control gate electrodes, it is possible to produce a memory chip having a memory of a high operation speed and a high rewrite cycle and a memory of high reliability at a low cost by jointly loading memory cells having different memory gate lengths in an identical chip.

13 Claims, 14 Drawing Sheets

SEMICONDUCTOR DEVICE AND PRODUCTION METHOD THEREOF

CROSS-REFERENCE TO RELATED APPLICATIONS

The disclosure of Japanese Patent Application No. 2009-132668 filed on Jun. 2, 2009 including the specification drawings and abstract is incorporated herein by reference in its entirety.

BACKGROUND OF THE INVENTION

The present invention relates: to a semiconductor device and a production method thereof; and in particular to a technology effectively applied to a semiconductor device having a nonvolatile memory cell a memory gate electrode of which is formed over the sidewall of a control gate electrode and a production method thereof.

A semiconductor device formed by jointly loading an electrically rewritable nonvolatile memory and a microcomputer over a single silicon substrate is widely used as an embedded microcomputer for an industrial machine, a household appliance, an in-vehicle device, or the like.

A nonvolatile memory in such a semiconductor device is used by storing and occasionally retrieving a program required by a microcomputer. As a nonvolatile memory cell having a structure suitable for such joint loading, there is a split gate type memory cell formed by coupling a control MIS (Metal Insulator Semiconductor) transistor to a memory MIS transistor in series.

Among the split gate type memory cells, in particular a memory cell of a structure formed by disposing the gate electrode of a memory MIS transistor (a memory gate electrode) over the sidewall of the gate electrode of a control MIS transistor (a control gate electrode) by using a self-aligning technology: can reduce the gate length of the memory gate electrode to a length not longer than the minimum resolution limit of lithography; and hence can realize a memory cell finer than a memory cell having a structure formed by individually forming a control gate electrode and a memory gate electrode by etching with a photoresist film as a mask.

In two kinds of MIS transistors configuring a split gate type memory cell, the memory MIS transistor stores information by making a charge retention film retain electric charge and there are mostly two kinds as the charge retention methods. One is a floating gate method of using a conductive polycrystalline silicon film as the charge retention film and the other is a MONOS (Metal Oxide Nitride Oxide Semiconductor) method of using an insulation film having a nature of accumulating electric charge such as a silicon nitride film as the charge retention film and storing the electric charge in the charge retention film.

Japanese Unexamined Patent Publication No. 2006-100531 discloses a technology of realizing the higher integration and improving the rewrite cycle of a semiconductor device having nonvolatile memory elements by: jointly loading a first MONOS nonvolatile memory element and a second MONOS nonvolatile memory element having a gate width wider than the first MONOS nonvolatile memory element over an identical substrate; and using the first MONOS nonvolatile memory element for storing program data of a low rewrite cycle and the second MONOS nonvolatile memory element for storing processing data of a high rewrite cycle.

An electrically rewritable nonvolatile memory such as an EEPROM (Electrically Erasable Programmable Read Only Memory) or a flash memory can rewrite a program in an on-board state, hence allows the development period to be shortened and the development efficiency to be improved, and thus is used in various applications including the application to the production of small batches of a variety of products, tuning for individual applications, and updating a program after delivery. In recent years, demands for a microcomputer jointly loaded with a flash memory are strong and the diversification of a specification required of a jointly loaded flash memory advances. In an in-vehicle application in particular, there are various requests for high reliability, high speed movement, the expansion of movement assurance temperature range, and the increase of a rewrite cycle.

In order to meet all the requests with a single kind of a memory cell however, it is necessary for example to develop a memory having a high operation speed, a high rewrite cycle, high reliability, and very high performance, but on this occasion the development period prolongs and the production cost increases undesirably. Consequently, a microcomputer loaded with memories that are selectively formed efficiently and have a plurality of capabilities conforming to intended uses in an identical chip is also developed.

SUMMARY OF THE INVENTION

In a conventional technology, when memory performance is controlled by changing the gate width (Wg) of a memory, the properties of the memory largely depend on the gate length and hence it is desired to improve the conventional technology so as to selectively obtain intended performance.

In the case of a split gate type memory in which a memory gate electrode is formed in the shape of a sidewall over a sidewall on one side of a control gate electrode, the length of the memory gate electrode is decided in accordance with the thickness of a gate polysilicon film in a self-aligning manner. That is, since the length of the memory gate electrode is decided in accordance with the thickness of a polysilicon film, it is desired to improve a technology of forming different memory gate lengths in an identical chip with a high degree of accuracy.

In view of the above situation, the present inventors have studied a method for selectively forming memory gate lengths in an identical chip accurately and easily and jointly loading memory cells having plural kinds of performance over the identical chip.

An object of the present invention is to provide a semiconductor device having a nonvolatile memory cell of a high operation speed and a high rewrite cycle and a nonvolatile memory cell of high reliability by jointly loading memory cells having different memory gate lengths in an identical chip.

Another object of the present invention is to provide a technology that can: shorten the development period of a semiconductor device having nonvolatile memory cells; and reduce the chip area at a low cost.

The above and other objects and novel features of the present invention will be obvious in reference to the descriptions and the attached drawings in the present specification.

The brief outline of the representative inventions among the inventions disclosed in the present application is explained as follows.

A semiconductor device according to the first aspect of the present application is a semiconductor device having a first memory cell and a second memory cell formed over the main face of a semiconductor substrate, in which: each of the first and second memory cells has a well of a first conductivity type formed in the semiconductor substrate, a first gate insulation film formed over the well, a control gate electrode formed over the semiconductor substrate through the first gate insulation film, a second gate insulation film extendedly formed over a sidewall on one side of the control gate electrode and the well, a memory gate electrode formed over the sidewall on one side of the control gate electrode and insulated from the control gate electrode and the semiconductor substrate through the second gate insulation film, a drain region comprising a semiconductor region of a second conductivity type functioning as the conductivity type opposite to the first conductivity type formed over the semiconductor substrate in the vicinity of the control gate electrode, and a source region comprising a semiconductor region of the second conductivity type formed over the semiconductor substrate in the vicinity of the memory gate electrode; and the gate length of the memory gate electrode of the first memory cell is longer than the gate length of the memory gate electrode of the second memory cell.

The effects obtained by representative inventions among the inventions disclosed in the present application are briefly explained as follows.

By jointly loading memory cells having different memory gate lengths in an identical chip, it is possible to provide a semiconductor device having a nonvolatile memory cell of a high operation speed and a high rewrite cycle and a nonvolatile memory cell of high reliability.

Further, it is possible to shorten the development period of a semiconductor device having nonvolatile memory cells and reduce the chip area at a low cost.

DETAILED DESCRIPTION OF THE PREFERRED EMBODIMENTS

Figure 1:
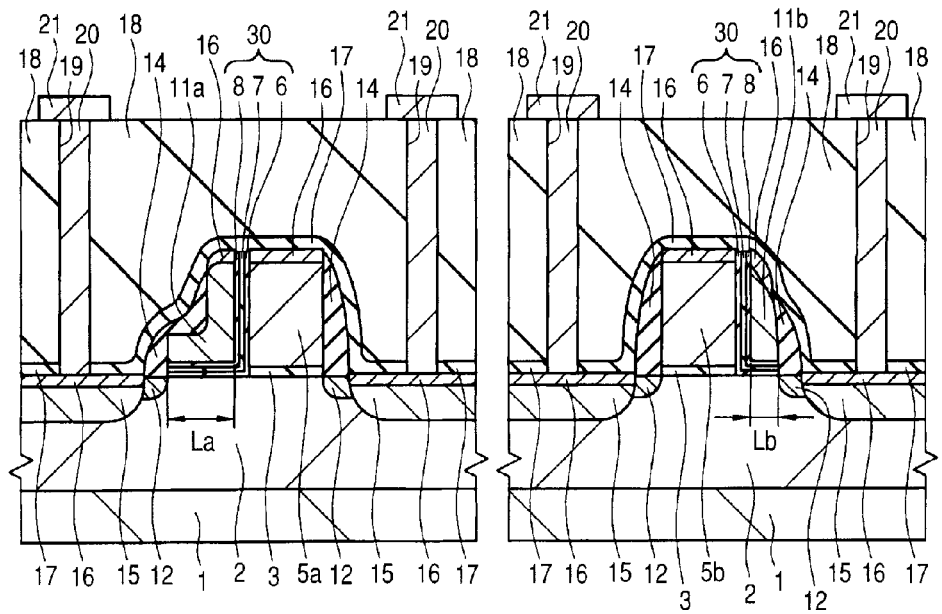
FIG. 1 is a sectional view showing a substantial part of a semiconductor device studied by the present inventors.

In each of the following embodiments, each embodiment is explained by being divided into plural sections or plural configurations if need arises for convenience sake but, unless otherwise specified, those divided sections or configurations are not unrelated to each other and one is related to a part or all of another as a modification, a detail, or a supplemental explanation of the other.

In each of the following embodiments further, when a number of elements and the like (including a number of pieces, a numerical value, a quantity, a range, and others) are referred to, the number of elements is not particularly limited to the specific number and may take a number more or less than the specific number unless otherwise specified or obviously limited to a specific number in principle.

In each of the following embodiments furthermore, it goes without saying that a component (including an element step) is not necessarily essential unless otherwise specified or obviously considered to be essential in principle. Additionally, it goes without saying that, with regard to a component or the like in an embodiment or the like, when "comprising A" or "being comprised of A" is referred to, the expression does not exclude another component unless otherwise specified exclusively as the component.

In each of the following embodiments likewise, when the shape, the positional relation, or the like of a component or the like is referred to, the shape or the like substantially includes a shape or the like that is closely related or similar to the shape or the like unless otherwise specified or obviously considered to be otherwise in principle. This concept is applied likewise to a numerical value and a range stated above.

Further, when a material or the like is referred to, the specified material is a primary material and a secondary material, an additive, an additional component, or the like is not excluded unless otherwise specified or denied in principle or circumstantially. For example, a silicon member includes not only pure silicon but also added impurities, binary and ternary alloys and other alloys containing silicon as the main component (SiGe for example), and others unless otherwise specified.

Furthermore, in all the drawings used for explaining the following embodiments, components having identical functions are represented by an identical symbol in principle and repeated explanations are avoided.

Moreover, in the drawings used in the following embodiments, even a plan view may be hatched partially in some cases in order to facilitate visualization.

Embodiment 1

Figure 2:
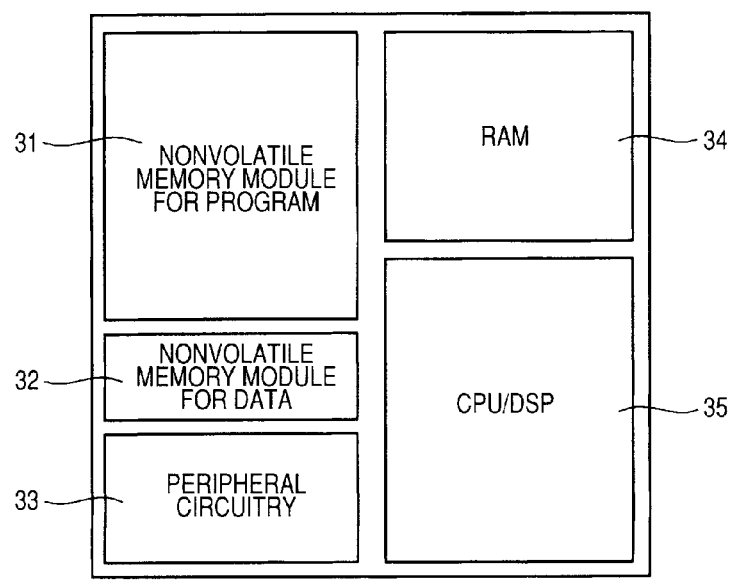
FIG. 2 is a plan view showing the layout of a microcomputer according to Embodiment 1 of the present invention.

FIG. 1 is a sectional view showing a substantial part in a memory alley region of a semiconductor device according to Embodiment 1 of the present invention. FIG. 2 is a plan view showing the layout of the semiconductor device according to Embodiment 1 of the present invention and the microcomputer is equipped with a nonvolatile memory module 31 for programs, a nonvolatile memory module 32 for data, a peripheral circuit 33, a RAM (Random Access Memory) 34, and a CPU (Central Processing Unit)/DSP (Digital Signal Processor) 35.

The semiconductor device according to the present embodiment includes a nonvolatile semiconductor memory device having split gate type memory cells of a MONOS type. The split gate type memory cells of the present embodiment comprise control MIS transistors and memory MIS transistors which are formed over a p-type well 2 in a p-type silicon substrate 1, as shown in FIG. 1. Gate electrodes of the control MIS transistors (control gate electrodes 5a and 5b) functioning as conductive films: comprise, for example, an n-type polycrystalline silicon film and a cobalt silicide film 16 that is a silicide film formed over the surface of the n-type polycrystalline silicon; and are formed over a gate insulation film 3 comprising an after-mentioned high permittivity film (a high-k film) such as a silicon oxide film or hafnium oxide (HfSiON). Gate electrodes of the memory MIS transistors (memory gate electrodes 11a and 11b) functioning as conductive films: comprise, for example, a n-type polycrystalline silicon film and a cobalt silicide film 16 that is a silicide film formed over the surface of the n-type polycrystalline silicon; and are disposed respectively over the sidewall on one side of each of the control gate electrodes 5a and 5b. The control gate electrodes 5a and 5b are coupled to a word line and the memory gate electrodes 11a and 11b are coupled to a memory gate line although the diagrammatic representation is omitted.

The memory gate electrodes 11a and 11b are electrically separated from the control gate electrodes 5a, 5b and the p-type well 2 through a gate insulation film comprising a bottom oxide film 6, a silicon nitride film 7, and a top oxide film 8. As described hereinafter, the silicon nitride 7 functions as a charge retention film.

In the p-type well 2 near the control gate electrodes 5a and 5b, is formed an $n^+$-type semiconductor region 15 functioning as a drain region and a source region of the memory cells. The drain region in the $n^+$-type semiconductor region 15 is coupled to a data line and the source region is coupled to a common source line. The data line and the source line are: formed over an interlayer insulation film 18 with which the memory cells are covered; and electrically coupled to the $n^+$-type semiconductor region 15 through contact plugs 20 in contact holes 19. The data line comprises a metal film mainly made of, for example, an aluminum alloy or a copper alloy and the contact plugs 20 comprise a metal film mainly made of, for example, tungsten.

In a region adjacent to the $n^+$-type semiconductor region 15 in the p-type well 2, is formed an $n^-$-type semiconductor region 12 having a lower impurity concentration than the $n^+$-type semiconductor region 15. The $n^-$-type semiconductor region 12 is an extension region for mitigating a high electrical field at the end of the $n^+$-type semiconductor region 15 and making the control MIS transistors form an LDD (Lightly Doped Drain) structure. Sidewalls 14 comprising a silicon oxide film functioning as an insulation film are formed over the sidewalls on the other sides of the control gate electrodes 5a and 5b and the sidewall on one side of each of the memory gate electrodes 11a and 11b. The sidewalls 14 are used for forming the $n^+$-type semiconductor region 15.

Here, a gate length referred to in the embodiments of the present specification means the length of a control gate electrode or a memory gate electrode in a direction (a second direction) perpendicular to a direction (a first direction) in which the control gate electrode or the memory gate electrode extends. Further, a gate width referred to in the embodiments means the length of a control gate electrode or a memory gate electrode in the first direction. Memory cells are separated in the first direction by an element isolation region (STI or LOCOS) over the semiconductor substrate but are commonly coupled to each other through the control gate electrodes and the memory gate electrodes extending in the first direction.

Here, the gate length La of the memory gate electrode 11a is longer than the gate length Lb of the memory gate electrode 11b. The memory cell having the memory gate electrode 11a of the longer gate length is formed in the nonvolatile memory module 32 for data shown in FIG. 2 and the memory cell having the memory gate electrode 11b of the shorter gate length is formed in the nonvolatile memory module 31 for programs shown in FIG. 2. In the present semiconductor device therefore, the memory cells having the memory gate electrodes of the different gate lengths are formed in a single chip over the identical substrate. Here, the gate width of the memory cells is identical in the present embodiment.

Figure 3:
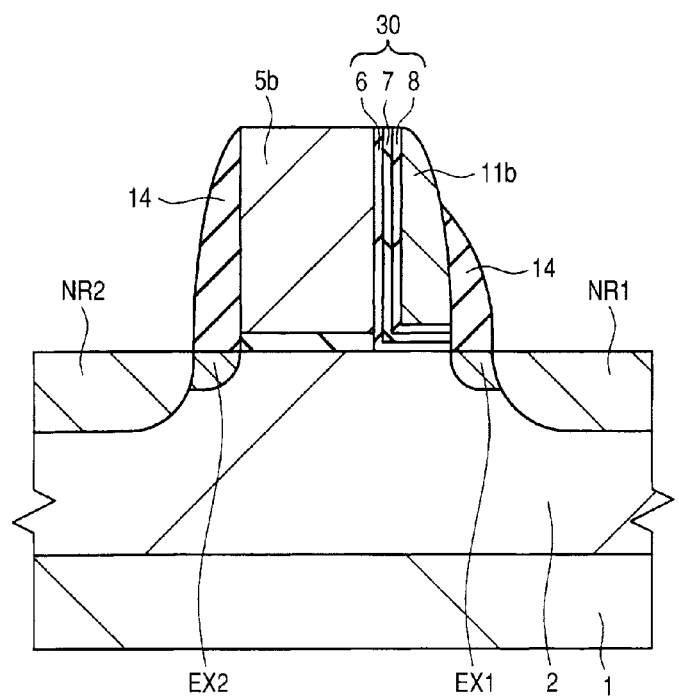
FIG. 3 is a sectional view of a substantial part explaining the movement of a nonvolatile memory.

Successively, movements of a nonvolatile memory cell according to Embodiment 1 are explained in reference to FIG. 3. Here, a voltage applied to a control gate electrode 5b is represented by Vcg and a voltage applied to a memory gate electrode 11b by Vmg. Further, voltages applied to a source region and a drain region are represented by Vs and Vd respectively and a voltage applied to a p-type well 2 by Vsub. Injection of electrons to a silicon nitride film 7 functioning as a charge retention film is defined as "writing" and injection of positive holes (holes) to a silicon nitride film 7 as "erasing".

Firstly, write operation is explained. The write operation is carried out by hot electron writing called a source side injection method. As the writing voltages for example, the voltage Vs applied to the source region is set at 5 V, the voltage Vmg applied to the memory gate electrode 11b at 10 V, and the voltage Vcg applied to the control gate electrode 5b at 1 V. Then the voltage Vd applied to the drain region is controlled so that a channel current may take a certain set value at writing. On this occasion, the voltage Vd is determined by the set value of the channel current and the threshold voltage of the selected transistor having the control gate electrode 5b and is about 0.5 V for example. The voltage Vsub applied to the p-type well 2 is 0 V. In the present specification, a semiconductor region to which a high voltage is applied at write operation is called a source region and a semiconductor region to which a low voltage is applied at write operation is commonly called a drain region. As shown in FIG. 3, the semiconductor region comprising the deep high-concentration impurity diffusion region NR1 and the shallow low-concentration impurity diffusion region EX1 on the memory gate electrode 11b side is the source region and the semiconductor region comprising the deep high-concentration impurity diffusion region NR2 and the shallow low-concentration impurity diffusion region EX2 on the control gate electrode 5b side is the drain region.

Movement of electric charge when such voltages are applied and write operation is carried out is shown. As stated above, electrons flow in the channel region formed between the source region and the drain region by imposing an electric potential difference between the voltage Vs applied to the source region and the voltage Vd applied to the drain region. The electrons flowing in the channel region: are accelerated in the channel region (between the source region and the drain region) under the vicinity of the boundary between the control gate electrode 5b and the memory gate electrode 11b; and come to be hot electrons. Then the hot electrons are injected into the silicon nitride film 7 under the memory gate electrode 11b in the electric field in the vertical direction caused by the positive voltage (Vmg=10 V) applied to the memory gate electrode 11b. The injected hot electrons are trapped in a trap level in the silicon nitride film 7 and, as a result, the electrons are accumulated in the silicon nitride film 7 and the threshold voltage of the memory transistor rises. The write operation is carried out in this way.

Successively, erasing operation is explained. The erasing operation is carried out by, for example, BTBT (Band to Band Tunneling) erasing in which hot holes generated by an interband tunneling phenomenon are injected. In the BTBT erasing for example, the voltage Vmg applied to the memory gate electrode 11b is set at −6 V, the voltage Vs applied to the source region at 6 V, the voltage Vcg applied to the control gate electrode 5b at 0 V, and the drain region is opened. By so doing, the positive holes generated at the source region edge by the voltage applied between the source region and the memory gate electrode 11b through the interband tunneling phenomenon are accelerated by the high voltage applied to the source region and come to be hot holes. Then some of the hot holes are drawn by the negative voltage applied to the memory gate electrode 11b and injected into the silicon nitride film 7. The injected hot holes are trapped in the trap level in the silicon nitride film 7 and the threshold voltage of the memory transistor lowers. The erasing operation is carried out in this way.

Successively, read operation is explained. Readout is carried out by setting the voltage Vd applied to the drain region at Vdd (1 V), the voltage Vs applied to the source region at 0 V, the voltage Vcg applied to the control gate electrode 5b at Vdd (1.5 V), and the voltage Vmg applied to the memory gate electrode 11b at 0 V, and applying electric current in the direction opposite to the direction at writing. It is also possible to carry out readout by applying electric current in the same direction as at the time of writing by interchanging the voltage Vd applied to the drain region and the voltage Vs applied to the source region and setting them at 0 V and 1 V respectively. On this occasion, when the memory cell is in the state of writing and the threshold voltage is high, electric current does not flow in the memory cell. In contrast, when the memory cell is in the state of erasing and the threshold voltage is low, electric current flows in the memory cell.

As stated above, it is possible to judge whether a memory cell is in the state of writing or in the state of erasing by detecting whether or not electric current flows in the memory cell. More specifically, whether or not electric current flows in a memory cell is detected with a sense amplifier. For example, a reference current is used in order to detect whether or not electric current flows in a memory cell. That is, when a memory cell is in the state of erasing, a read current flows at the time of readout and the read current is compared with the reference current. The reference current is set so as to be lower than the read current in the state of erasing and, as a result of comparing the read current with the reference current, when the read current is larger than the reference current, it is judged that the memory cell is in the state of erasing. In contrast, when the memory cell is in the state of writing, the read current does not flow. That is, as a result of comparing the read current with the reference current, when the read current is smaller than the reference current, it is judged that the memory cell is in the state of writing. The read operation is carried out in this way.

The above operations are not changed even in a memory cell having a memory gate electrode of a different gate length.

A method for producing nonvolatile memories according to the present embodiment is hereunder explained in the order of the process steps in reference to FIGS. 4 to 14.

Figure 4:
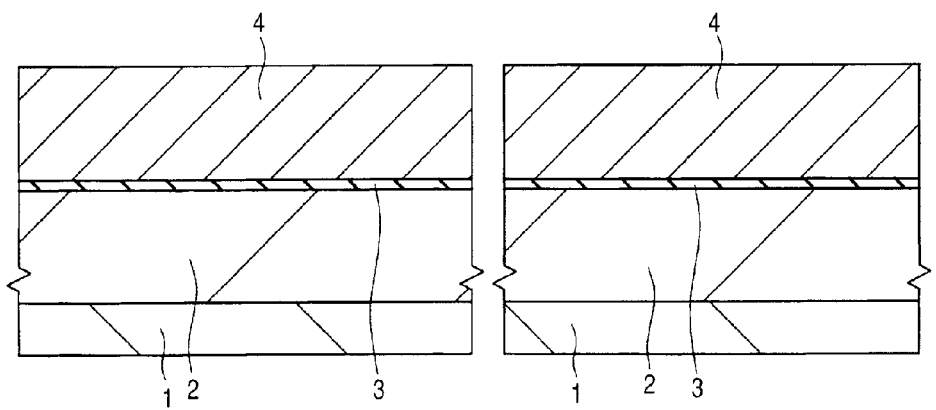
FIG. 4 is a sectional view of a substantial part showing the production method of a semiconductor device according to Embodiment 1 of the present invention.

Firstly, as shown in FIG. 4, a p-type well 2 is formed by ion-implanting p-type impurities (for example B (boron)) in the main face of a silicon substrate 1, a gate insulation film 3 about 1 to 5 nm in thickness comprising for example silicon oxide is formed over the surface of the silicon substrate 1, and thereafter a polycrystalline silicon film 4 for example about 200 nm in thickness is formed as a conductive film over the main face of the silicon substrate 1 by a CVD method. Here, the gate insulation film 3 is not limited to silicon oxide and may comprise a silicon oxynitride film (SiON) or a high-dielectric film having a higher dielectric constant than a silicon oxide film. When the gate insulation film 3 is formed with a silicon oxynitride film, the effects of inhibiting an interface state from being generated in the film and reducing electron trap are higher than a silicon oxide film. Consequently, it is possible to improve the hot carrier tolerance and the insulation performance of the gate insulation film GOX. Further, in the case of a silicon oxynitride film, impurities penetrate more hardly than in the case of a silicon oxide film. In contrast, when the gate insulation film 3 is formed with a gate insulation high-dielectric film, it is possible to increase the physical film thickness even when the capacity is unchanged and hence reduce leak current. For example, a hafnium oxide film ($HfO_2$ film) that is a kind of hafnium oxides is used as a high-dielectric film but, in place of the hafnium oxide film, another hafnium-system insulation film such as a hafnium aluminate film, an HfON film (a hafnium oxynitride film), an HfSiO film (a hafnium silicate film), an HfSiON film (a hafnium silicon oxynitride film), or an HfAlO film may be used. Further, it is also possible to use a hafnium-system insulation film produced by introducing oxide such as tantalum oxide, niobium oxide, titanium oxide, zirconium oxide, lanthanum oxide, or yttrium oxide into such a hafnium-system insulation film. A hafnium-system insulation film, like a hafnium oxide film, has a higher dielectric constant than a silicon oxide film or a silicon oxynitride film and hence can obtain effects similar to the case where a hafnium oxide film is used.

Figure 5:
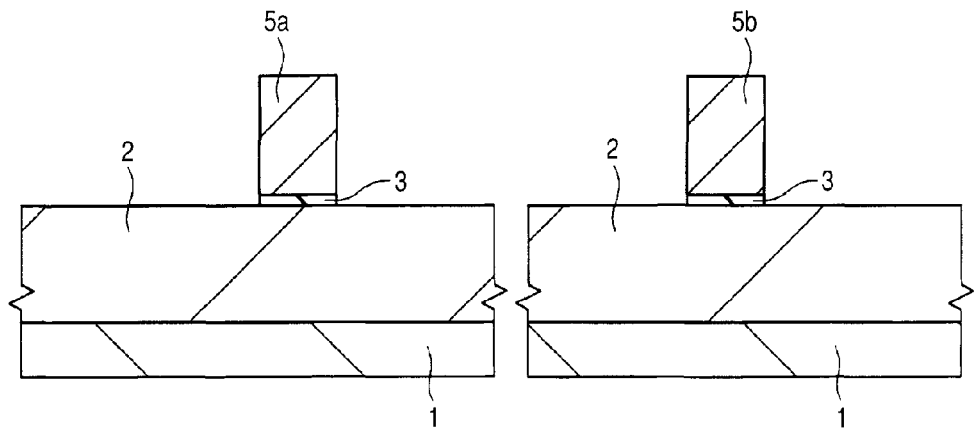
FIG. 5 is a sectional view of the substantial part showing the production method of the semiconductor device in succession to FIG. 4.

Successively, as shown in FIG. 5, parts of the polycrystalline silicon film 4 and the gate insulation film 3 are removed by dry etching in which a photoresist film (not shown in the figure) is used as the mask and control gate electrodes 5a and 5b comprising the polycrystalline silicon film 4 are formed respectively.

Figure 6:
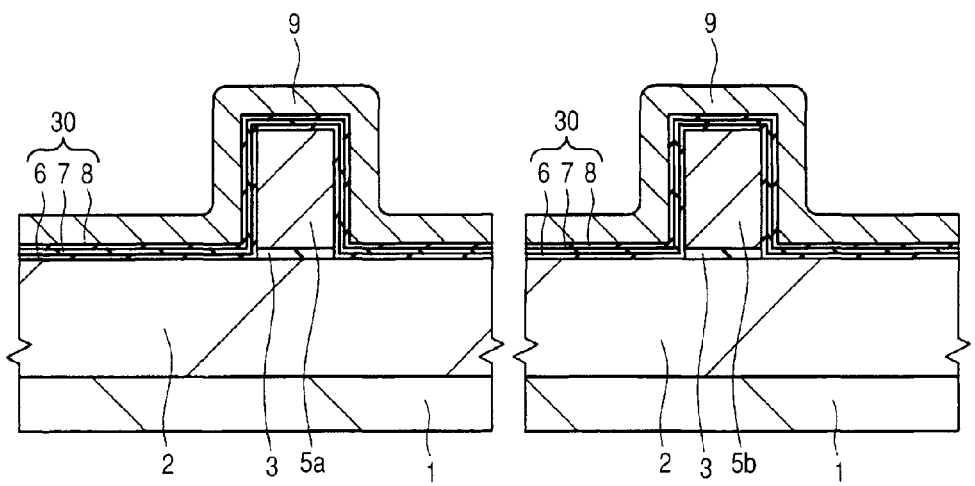
FIG. 6 is a sectional view of the substantial part showing the production method of the semiconductor device in succession to FIG. 5.

Successively, as shown in FIG. 6, a bottom oxide film 6 as a potential barrier film becoming a part of a memory gate insulation film is formed over the main face of the silicon substrate 1. The bottom oxide film 6 is formed for example by a thermal oxidation method or an ISSG oxidation method. Successively, a silicon nitride film 7 as a charge retention film becoming a part of the memory gate insulation film is formed. The silicon nitride film 7 is formed for example by using dichlorosilane ($SiH_2Cl_2$) and ammonia ($NH_3$) as the raw materials and a thermal CVD method of about 800° C. and the thickness of the film is set at about 5 to 20 nm. The thickness of the silicon nitride film 7 is determined arbitrarily from the viewpoint of requirement for reducing operating voltage and improving charge retention properties. Further, a top oxide film 8 as a potential barrier film becoming a part of the memory gate insulation film is formed. The top oxide film 8 is formed by oxidizing a part of the silicon nitride film 7 by an ISSG oxidation method. The top oxide film 8 may be formed also by a dry oxidation method, a wet oxidation method, or a plasma oxidation method, in place of the ISSG oxidation method. Further, the top oxide film 8 may be formed also by depositing a silicon oxide film by a CVD method. The triple-layered film comprising the bottom oxide film 6, the silicon nitride film 7, and the top oxide film 8 may collectively be referred to as an ONO film 30. Thereafter, a polycrystalline silicon film 9 is deposited over the main face of the silicon substrate 1 by a CVD method. Here, as the charge retention film, a film formed by dispersing silicon nanocrystalline particles in a silicon oxide film may be used in place of the silicon nitride film. The silicon nanocrystalline particles are fine crystalline silicon particles having diameters of several nanometers.

Figure 7:
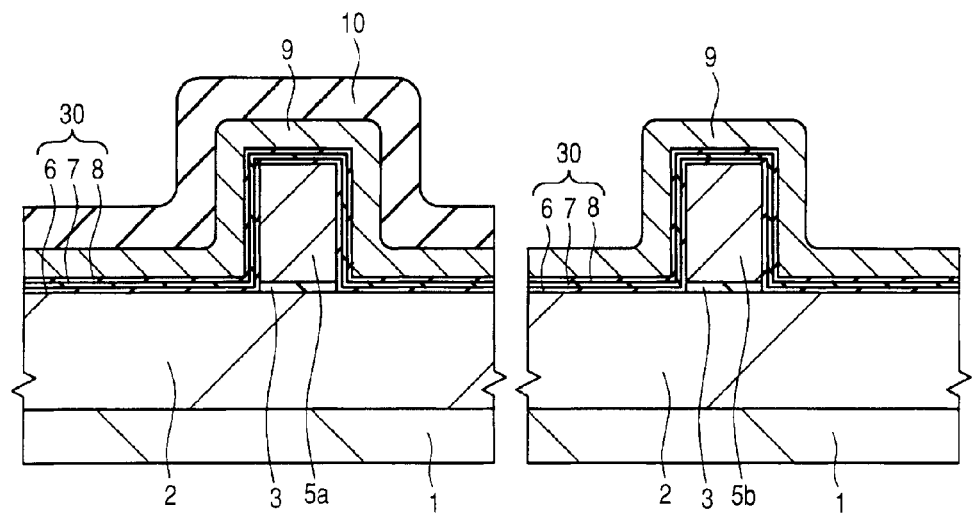
FIG. 7 is a sectional view of the substantial part showing the production method of the semiconductor device in succession to FIG. 6.

Successively, as shown in FIG. 7, a silicon oxide film 10 is deposited over the main face of the silicon substrate 1 by a CVD method and thereafter, by using a photolithography technology, a part of the silicon oxide film 10 is removed by dry etching so that the silicon oxide film 10 may remain over the polycrystalline silicon film 9 formed over the sidewall of the control gate electrode 5a. That is, the silicon oxide film 10 over the polycrystalline silicon film 9 formed over the sidewall of the control gate electrode 5b is removed.

Figure 8:
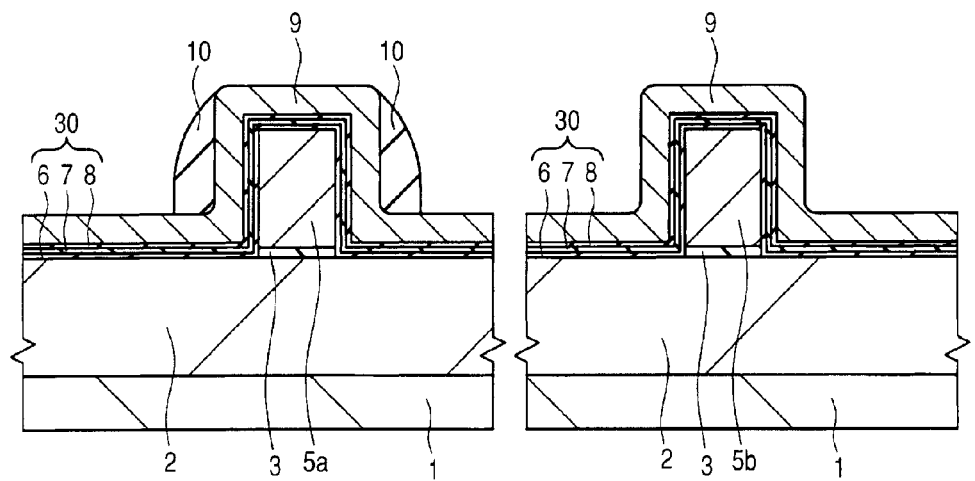
FIG. 8 is a sectional view of the substantial part showing the production method of the semiconductor device in succession to FIG. 7.

Successively, as shown in FIG. 8, the silicon oxide film 10 is etched back by dry etching and a part of the silicon oxide film 10 is left in the shape of a sidewall over both the sidewalls of the polycrystalline silicon film 9 with which the control gate electrode 5a is covered. When this etching is applied, etching conditions that allow the silicon oxide film 10 to be sufficiently etched and do not substantially allow the polycrystalline silicon film 9 to be etched are used.

Figure 9:
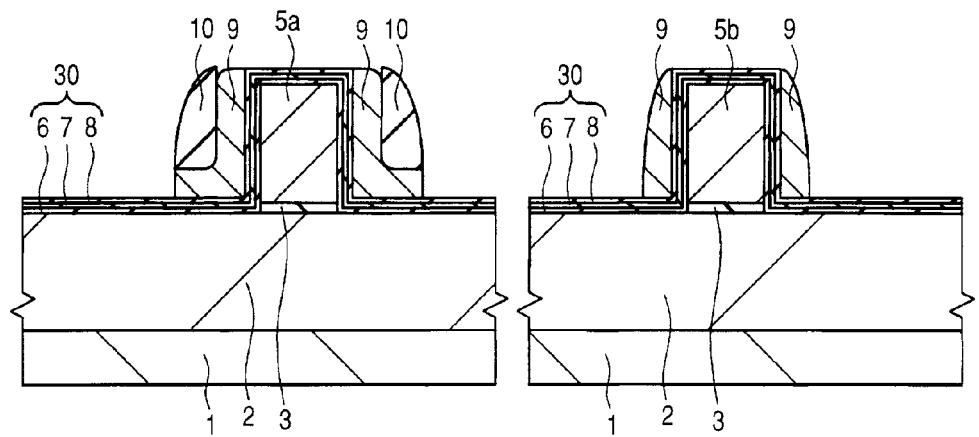
FIG. 9 is a sectional view of the substantial part showing the production method of the semiconductor device in succession to FIG. 8.

Successively, as shown in FIG. 9, parts of the polycrystalline silicon film 9 are removed by dry etching. On this occasion, over the sidewall of the ONO film 30 with which the control gate electrode 5b is covered, a part of the polycrystalline silicon film 9 is formed in the shape of a sidewall in a self-aligning manner but, over the sidewall of the ONO film 30 with which the control gate electrode 5a is covered, the silicon oxide film 10 functions as a mask and the polycrystalline silicon film 9 remains also under the silicon oxide film 10. Consequently, the length in the lateral direction of the bottom portion of the polycrystalline silicon film 9 formed over the sidewalls of the control gate electrode 5a comes to be longer than the length in the lateral direction of the bottom portion of the polycrystalline silicon film 9 formed over the sidewalls of the control gate electrode 5b. When this etching is applied, etching conditions that allow the polycrystalline silicon film 9 to be sufficiently etched and do not substantially allow the silicon oxide film 10 to be etched are used.

Figure 10:
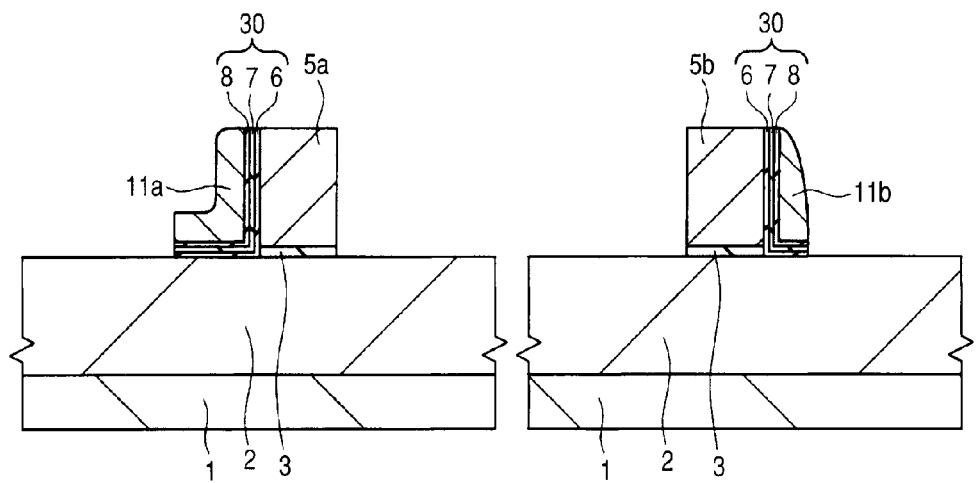
FIG. 10 is a sectional view of the substantial part showing the production method of the semiconductor device in succession to FIG. 9.

Successively, as shown in FIG. 10, the silicon oxide film 10 is removed by dry etching or wet etching and thereafter a photoresist film (not shown in the figure) is formed over the main face of the silicon substrate 1. Thereafter, the polycrystalline silicon film 9 on one side of each of the control gate electrodes 5a and 5b is removed by dry etching and the photoresist film is removed. Further, a part of the triple-layered insulation film comprising the bottom oxide film 6, the silicon nitride film 7, and the top oxide film 8 configuring the gate insulation film of the memory gate electrodes 11a and 11b is removed by etching with hydrofluoric acid and phosphoric acid. By so doing, the ONO film 30 remains only around the region covered with the memory gate electrodes 11a and 11b comprising parts of the polycrystalline silicon film 9 (the sidewall on one side of each of the control gate electrodes 5a and 5b and the bottom portions of the memory gate electrodes 11a and 11b) and the ONO film 30 of the other region is removed.

Figure 11:
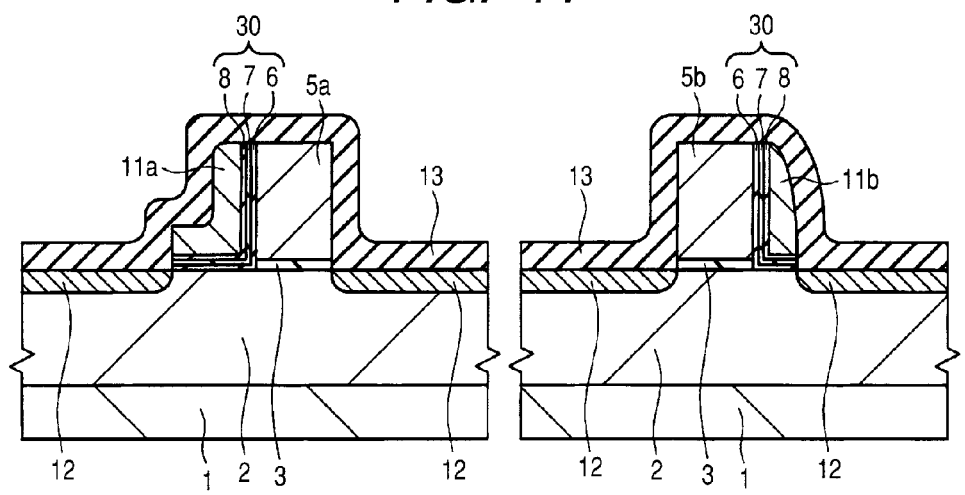
FIG. 11 is a sectional view of the substantial part showing the production method of the semiconductor device in succession to FIG. 10.

Successively, as shown in FIG. 11, an n⁻-type semiconductor region 12 is formed in the p-type well 2 by ion-injecting n-type impurities (for example, P (phosphorus)) into the p-type well 2 at a low concentration and thereafter a silicon oxide film 13 is deposited over the main face of the silicon substrate 1 by a CVD method.

Figure 12:
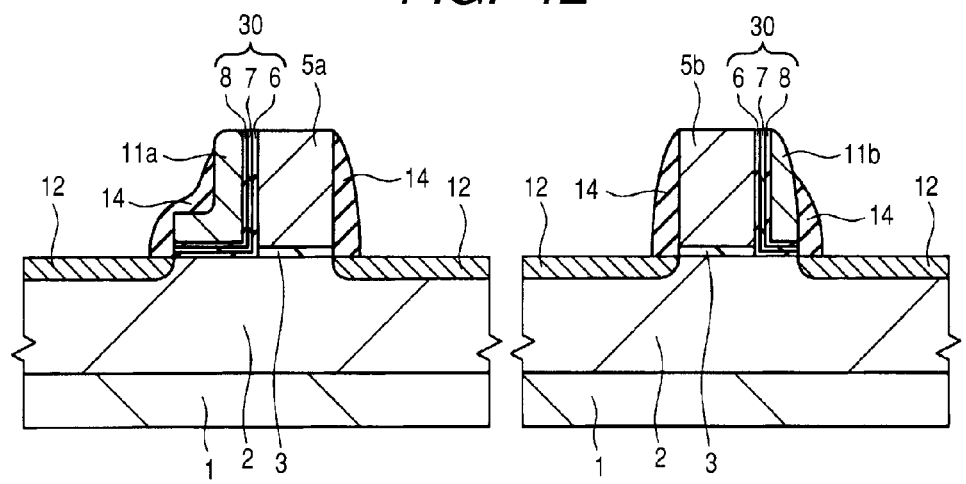
FIG. 12 is a sectional view of the substantial part showing the production method of the semiconductor device in succession to FIG. 11.

Successively, as shown in FIG. 12, the silicon oxide film 13 is etched back by dry etching and sidewalls 14 comprising the silicon oxide film 13 are formed.

Figure 13:
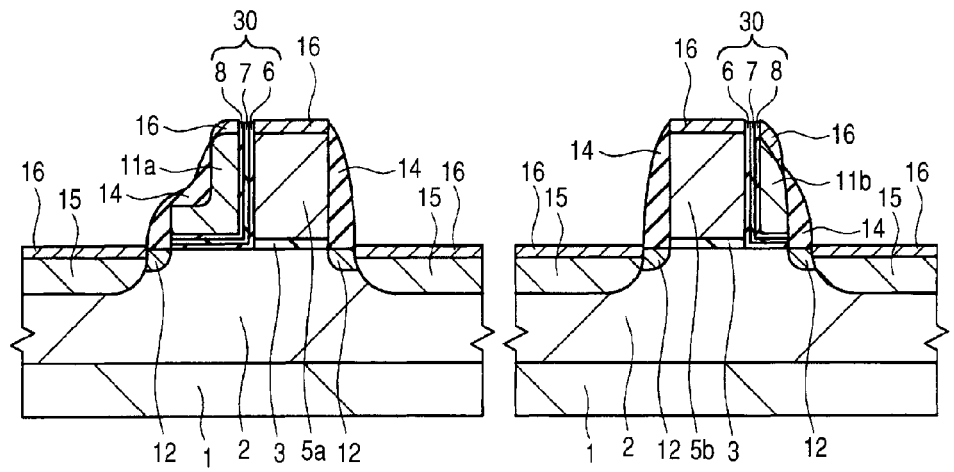
FIG. 13 is a sectional view of the substantial part showing the production method of the semiconductor device in succession to FIG. 12.

Successively, as shown in FIG. 13, an n⁺-type semiconductor region (source and drain regions) 15 is formed by: ion-injecting n-type impurities (for example, P) into the p-type well 2 at a high concentration; thereafter applying heat treatment to the silicon substrate 1; and thus dispersing the impurities. Thereafter, the control gate electrodes 5a and 5b, the memory gate electrodes 11a and 11b, and the upper portion of the n⁺-type semiconductor region 15 are silicified and a cobalt silicide film 16 is formed. The cobalt silicide film 16 is completed through the steps of: firstly depositing a cobalt film over the main face of the silicon substrate 1 by sputtering; successively applying heat treatment to the silicon substrate 1; and thereafter removing the unreacted cobalt film by wet etching. As a silicide film, a nickel silicide film, a titanium silicide film, or a platinum silicide film may be formed.

Figure 14:
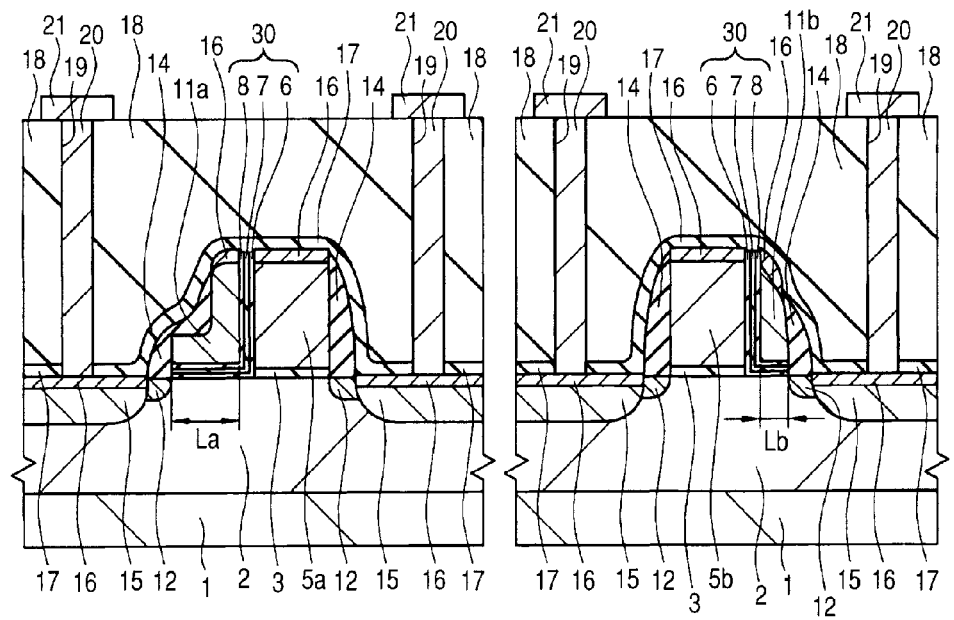
FIG. 14 is a sectional view of the substantial part showing the production method of the semiconductor device in succession to FIG. 13.

Successively, as shown in FIG. 14, an etching stopper film 17 comprising a silicon nitride film and an interlayer insulation film 18 comprising a silicon oxide film are deposited over the silicon substrate 1. Successively, contact holes 19 are formed in the etching stopper film 17 and the interlayer insulation film 18, contact plugs 20 are embedded into the interior thereof, thereafter wires 21 are formed over the interlayer insulation film 18, and thereby split gate type memories of a MONOS type shown in FIGS. 1 and 2 are completed.

Here, the gate length of the control gate electrodes 5a and 5b is set at a length in the range of 35 to 200 nm, the gate length La of a memory gate electrode 5a is set at a length of 100 nm or less, and the gate length Lb of the other memory gate electrode 5b is set at a length of 30 nm or more.

Here, the gate length La is set so as to be longer than the gate length Lb by the length corresponding to the thickness of the silicon oxide film 10. That is, the gate lengths of the memory gate electrodes of each memory cell are set so as to be in the range of 40 to 100 nm and satisfy the condition La>Lb. By so doing, in the present embodiment, it comes to be possible to jointly loading memories having plural kinds of performance conforming to the intended uses in an identical chip by forming split gate type memories containing memory gate electrodes having gate lengths different from each other. Further, it comes to be possible to selectively produce memory gate electrodes having gate lengths different from each other easily and with a high degree of accuracy by inhibiting the number of process steps from increasing and using a self-aligning technology.

Further, a memory MIS transistor including the memory gate electrode 11a: has a gate length La identical to or longer than the gate length of the control gate electrode 5a; thus has a wide range for accumulating electric charge; hence has high memory reliability; and is used mainly for storing data.

Furthermore, a memory MIS transistor including the memory gate electrode 11b: has a gate length Lb shorter than the gate length of the control gate electrode 5b; thus can reduce the memory cell area; can increase the speed of erasing electric charge and the speed of read operation; and hence is used mainly for programs.

Embodiment 2

A method for producing nonvolatile memories according to the present embodiment is hereunder explained in the order of the process steps in reference to FIGS. 15 to 21.

Figure 15:
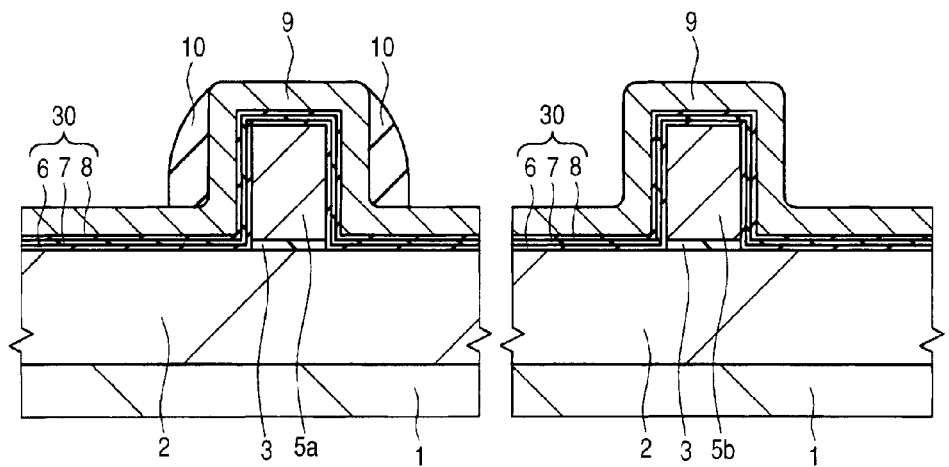
FIG. 15 is a sectional view of a substantial part showing the production method of a semiconductor device according to Embodiment 2 of the present invention.

Firstly, as shown in FIG. 15, in the same way as Embodiment 1, a gate insulation film 3 and control gate electrodes 5a and 5b are formed respectively over the main face of a silicon substrate 1 having a p-type well 2. Thereafter an ONO film 30, a polycrystalline silicon film 9, and a silicon oxide film 10 are deposited sequentially over the main face of the silicon substrate 1 and parts of the silicon oxide film 10 are removed by dry etching in which a photolithography technology is used so that the silicon oxide film 10 may remain over the polycrystalline silicon film 9 formed over the sidewalls of the control gate electrode 5a. That is, the silicon oxide film 10 over the polycrystalline silicon film 9 formed over the sidewalls of the control gate electrode 5b is removed. Thereafter, the remaining silicon oxide film 10 is etched back by dry etching and is left over both the sidewalls of the polycrystalline silicon film 9 in the shape of a sidewall. When this etching is applied, etching conditions that allow the silicon oxide film 10 to be sufficiently etched and do not substantially allow the polycrystalline silicon film 9 to be etched are used.

Figure 16:
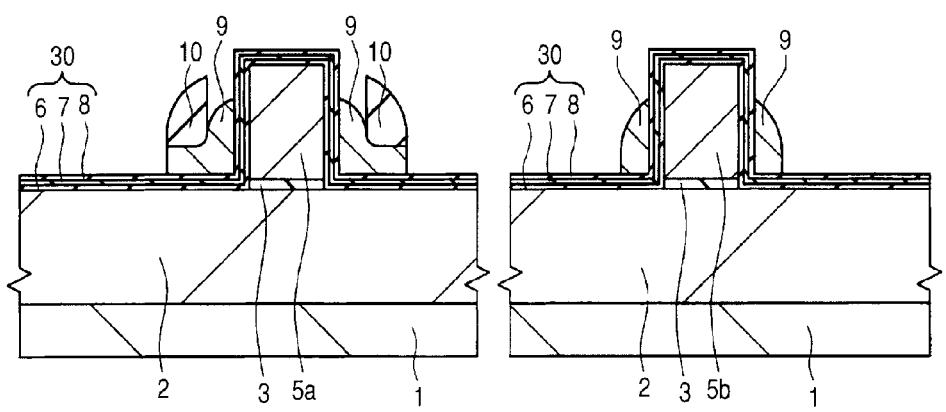
FIG. 16 is a sectional view of the substantial part showing the production method of the semiconductor device in succession to FIG. 15.

Successively, as shown in FIG. 16, parts of the polycrystalline silicon film 9 are removed by dry etching. On this occasion, over the sidewalls of the ONO film 30 with which the control gate electrode 5b is covered, parts of the polycrystalline silicon film 9 are formed in the shape of a sidewall in a self-aligning manner but, over the sidewalls of the ONO film 30 with which the control gate electrode 5a is covered, the silicon oxide film 10 functions as a mask and the polycrystalline silicon film 9 remains also under the silicon oxide film 10. When this etching is applied, etching conditions that allow the polycrystalline silicon film 9 to be sufficiently etched and do not substantially allow the silicon oxide film 10 to be etched are used.

Here, when dry etching is applied to the polycrystalline silicon film 9, the quantity of the shaved polycrystalline silicon film 9 is increased and the height of the polycrystalline silicon film 9 after the etching is lowered to a level lower than the case of Embodiment 1 by adjusting the time spent for dry etching. That is, the polycrystalline silicon film is over-etched so that the height of the polycrystalline silicon film 9 may be lower than the height of the control gate electrodes 5a and 5b.

Figure 17:
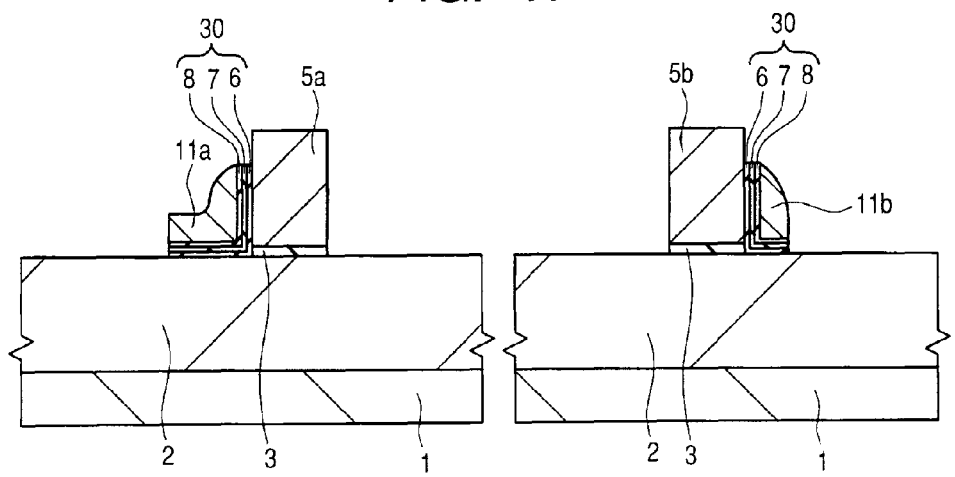
FIG. 17 is a sectional view of the substantial part showing the production method of the semiconductor device in succession to FIG. 16.

Successively, as shown in FIG. 17, the silicon oxide film 10 is removed by dry etching or wet etching and thereafter a photoresist film (not shown in the figure) is formed over the main face of the silicon substrate 1. Thereafter, the polycrystalline silicon film 9 on one side of each of the control gate electrodes 5a and 5b is removed by dry etching, a part of the triple-layered insulation film comprising the bottom oxide film 6, the silicon nitride film 7, and the top oxide film 8 configuring the gate insulation film is removed by etching with hydrofluoric acid and phosphoric acid, and thereafter the photoresist film is removed. By so doing, the ONO film 30 remains only between the memory gate electrodes 11a and 11b comprising parts of the polycrystalline silicon film 9 and the control gate electrodes 5a and 5b and between the memory gate electrodes 11a and 11b and the p-type well 2, and the ONO film 30 of the other region is removed.

Figure 18:
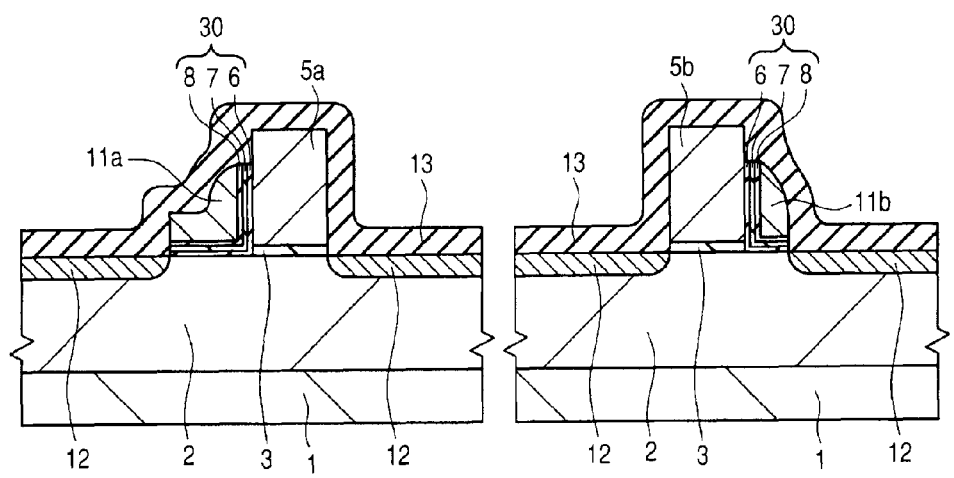
FIG. 18 is a sectional view of the substantial part showing the production method of the semiconductor device in succession to FIG. 17.

Successively, as shown in FIG. 18, an n⁻-type semiconductor region 12 is formed in the p-type well 2 by ion-injecting n-type impurities (for example, P (phosphorus)) into the p-type well 2 at a low concentration and thereafter a silicon oxide film 13 is deposited over the main face of the silicon substrate 1 by a CVD method.

Figure 19:
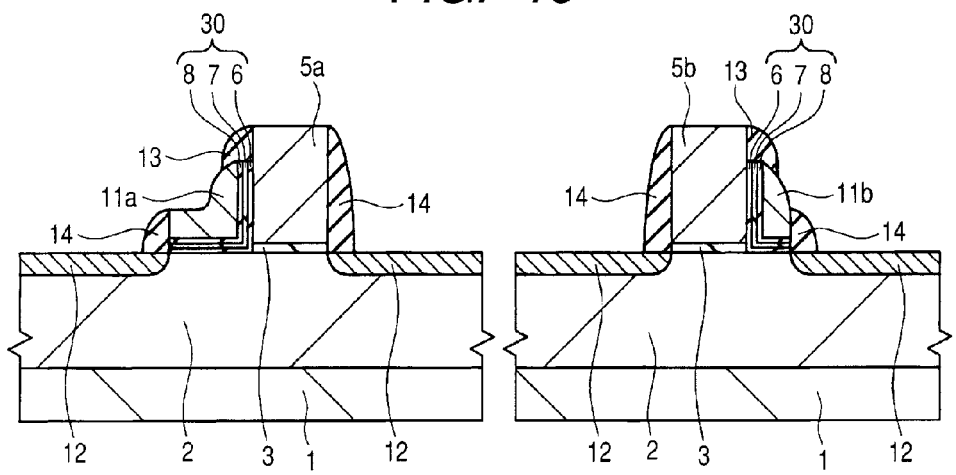
FIG. 19 is a sectional view of the substantial part showing the production method of the semiconductor device in succession to FIG. 18.

Successively, as shown in FIG. 19, the silicon oxide film 13 is etched back by dry etching and sidewalls 14 comprising the silicon oxide film 13 are formed. On this occasion, since the height of the memory gate electrodes 11a and 11b is lower than the height of the control gate electrodes 5a and 5b, parts of the top faces of the memory gate electrodes 11a and 11b are covered with the silicon oxide film 13 remaining over the sidewalls of the control gate electrodes 5a and 5b. Meanwhile, with regard to the sidewall 14 formed over the sidewall of the memory gate electrode 11a, since the height of the memory gate electrode 11a is lowered by over etching as shown in FIG. 16, the sidewall 14 is not formed unlike the case of Embodiment 1 or, even if it is formed, formed in a smaller region than the case of Embodiment 1 in the region where the silicon oxide film 10 removed through the process step shown in FIG. 17 has been formed. The size of the region where the sidewall 14 is formed in the region where the silicon oxide film 10 removed through the process step shown in FIG. 17 has been formed varies in accordance with the quantity of the memory gate electrode 11a to be over-etched through the process step shown in FIG. 16. FIG. 19 and the figures showing the succeeding process steps show the case where the sidewall 14 is not formed in the region where the silicon oxide film 10 removed through the process step shown in FIG. 17 has been formed.

Figure 20:
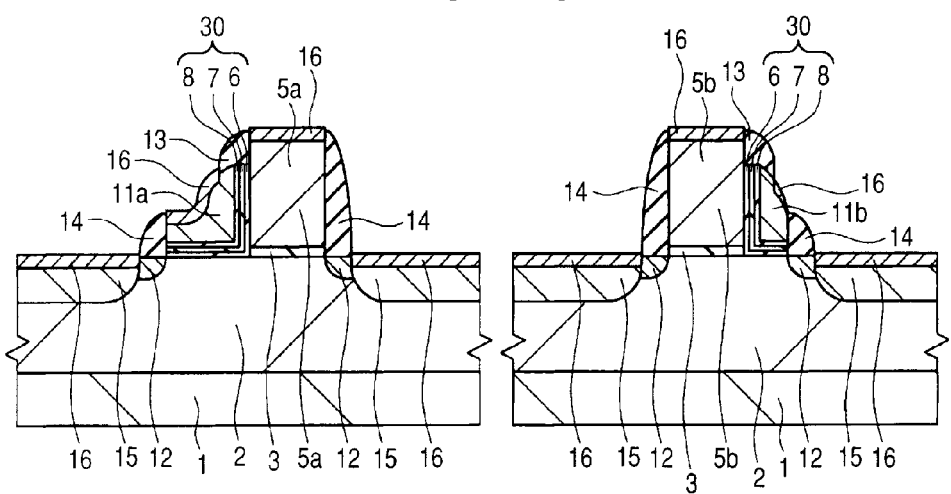
FIG. 20 is a sectional view of the substantial part showing the production method of the semiconductor device in succession to FIG. 19.

Successively, as shown in FIG. 20, an n⁺-type semiconductor region (source and drain regions) 15 is formed by: ion-injecting n-type impurities (for example, P) into the p-type well 2 at a high concentration; thereafter applying heat treatment to the silicon substrate 1; and thus dispersing the impurities. Thereafter, the control gate electrodes 5a and 5b, the memory gate electrodes 11a and 11b, and the upper portion of the n⁺-type semiconductor region 15 are silicified and a cobalt silicide film 16 is formed. The cobalt silicide film 16 is completed through the steps of: firstly depositing a cobalt film over the main face of the silicon substrate 1 by sputtering; successively applying heat treatment to the silicon substrate 1; and thereafter removing the unreacted cobalt film by wet etching. As a silicide film, a nickel silicide film, a titanium silicide film, or a platinum silicide film may be formed.

On this occasion, since the region where the memory gate electrode 11a is covered with the sidewall 14 formed through the process step shown in FIG. 19 is smaller than the case of Embodiment 1, the size of the region where the cobalt silicide film 16 is formed over the surface of the memory gate electrode 11a in the process step increases. As a result, it comes to be possible to reduce the resistance of the memory gate electrode 11a in comparison with the case of Embodiment 1.

On this occasion further, since the silicon oxide film 13 is formed between the control gate electrode 5a and the memory gate electrode 11a, the distance between the cobalt silicide film 16 over the control gate electrode 5a and the cobalt silicide film 16 over the memory gate electrode 11a increases. As a result, it comes to be possible to reduce the probability of short-circuit generated between the cobalt silicide film 16 over the control gate electrode 5a and the cobalt silicide film 16 over the memory gate electrode 11a.

Furthermore, since the silicon oxide film 13 is formed between the control gate electrode 5b and the memory gate electrode 11b, the distance between the cobalt silicide film 16 over the control gate electrode 5b and the cobalt silicide film 16 over the memory gate electrode 11b increases. As a result, it comes to be possible to reduce the probability of short-circuit generated between the cobalt silicide film 16 over the control gate electrode 5b and the cobalt silicide film 16 over the memory gate electrode 11b.

Figure 21:
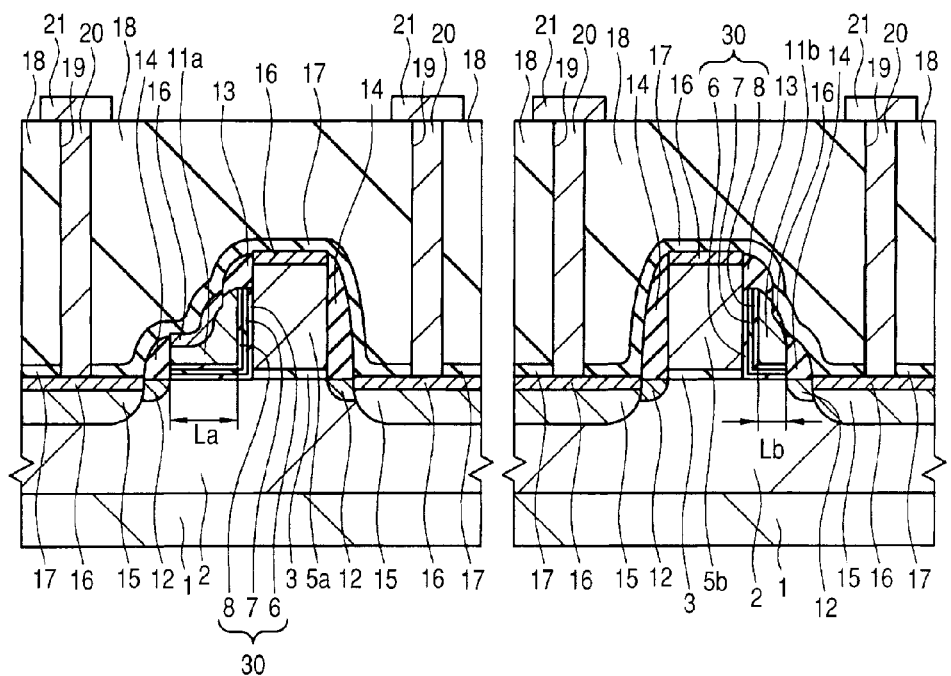
FIG. 21 is a sectional view of the substantial part showing the production method of the semiconductor device in succession to FIG. 20.

The succeeding process steps are applied as shown in FIG. 21 in the same way as Embodiment 1. That is, an etching stopper film 17 and an interlayer insulation film 18 are deposited over the silicon substrate 1, contact holes 19 are formed in the etching stopper film 17 and the interlayer insulation film 18, contact plugs 20 are embedded into the interior thereof, thereafter wires 21 are formed over the interlayer insulation film 18, and thereby split gate type memories of a MONOS type are completed.

Here, the gate length La is set so as to be longer than the gate length Lb by the length corresponding to the thickness of the silicon oxide film 10 and, in the present embodiment, it comes to be possible to jointly loading memories having plural kinds of performance conforming to the intended uses in an identical chip by forming split gate type memories containing memory gate electrodes having gate lengths different from each other. Further, it comes to be possible to selectively produce memory gate electrodes having gate lengths different from each other easily and with a high degree of accuracy by inhibiting the number of process steps from increasing and using a self-aligning technology.

Further, in the present embodiment, since the silicon oxide film 13 is formed over the memory gate electrodes 11a and 11b by setting the height of the top faces of the memory gate electrodes 11a and 11b so as to be lower than the control gate electrodes 5a and 5b, the leak current caused by approximation of the electrodes is inhibited from being generated between the memory gate electrode 11a and the control gate electrode 5a and between the memory gate electrode 11b and the control gate electrode 5b respectively.

Embodiment 3

A method for producing nonvolatile memories according to the present embodiment is hereunder explained in the order of the process steps in reference to FIGS. 22 to 26.

Figure 22:
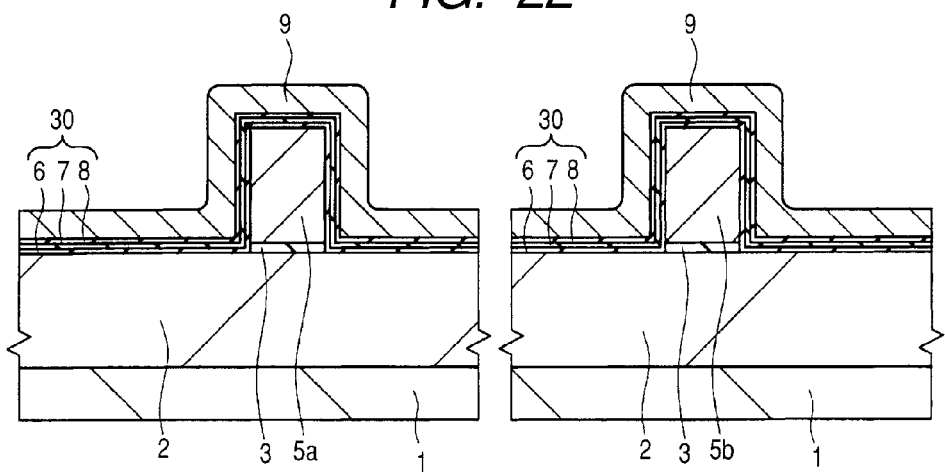
FIG. 22 is a sectional view of a substantial part showing the production method of a semiconductor device according to Embodiment 3 of the present invention.

Firstly, as shown in FIG. 22, in the same way as Embodiment 1, a gate insulation film 3 and control gate electrodes 5a and 5b are formed respectively over the main face of a silicon substrate 1 having a p-type well 2. Thereafter an ONO film 30 and a polycrystalline silicon film 9 are deposited sequentially over the main face of the silicon substrate 1.

Figure 23:
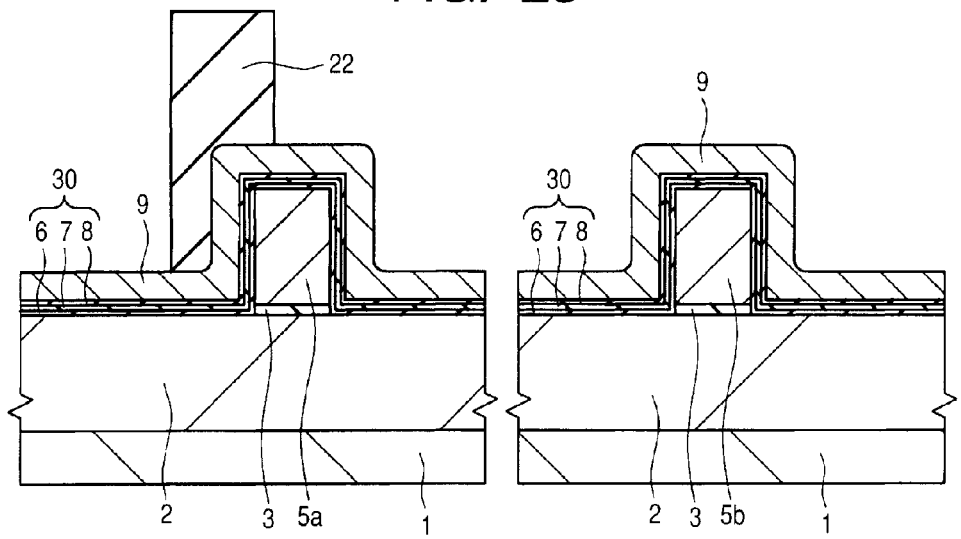
FIG. 23 is a sectional view of the substantial part showing the production method of the semiconductor device in succession to FIG. 22.

Successively, as shown in FIG. 23, a photoresist film 22 is formed over the main face of the silicon substrate 1 and, on this occasion, the photoresist film 22 is formed so that only the vicinity of the sidewall on one side of the control gate electrode 5a may be covered with the photoresist film 22.

Figure 24:
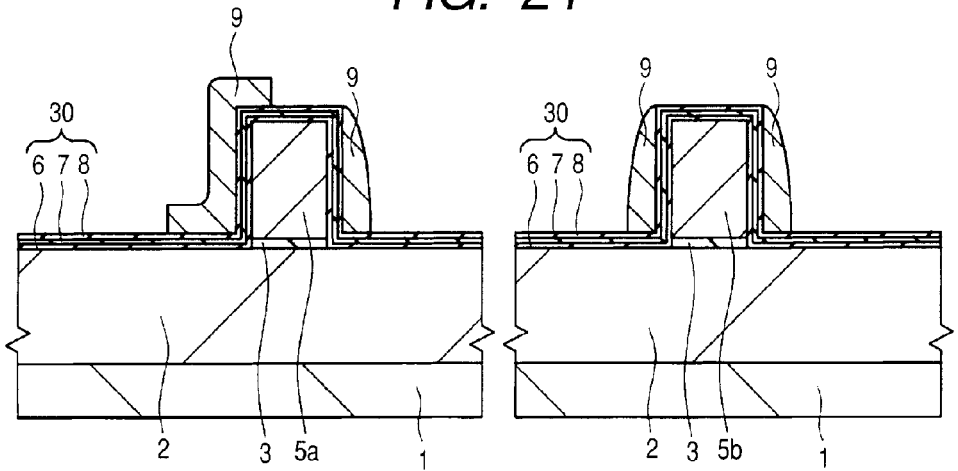
FIG. 24 is a sectional view of the substantial part showing the production method of the semiconductor device in succession to FIG. 23.

Successively, as shown in FIG. 24, parts of the polycrystalline silicon film 9 are removed by dry etching. On this occasion, over the sidewall of the ONO film 30 with which the control gate electrode 5b is covered and over the sidewall on one side of the ONO film 30 with which the control gate electrode 5a is covered, parts of the polycrystalline silicon film 9 are formed in the shape of a sidewall in a self-aligning manner. Over the sidewall on the other side of the ONO film 30 with which the control gate electrode 5a is covered, the polycrystalline silicon film 9 remains by using a photoresist film 22 as the mask.

Figure 25:
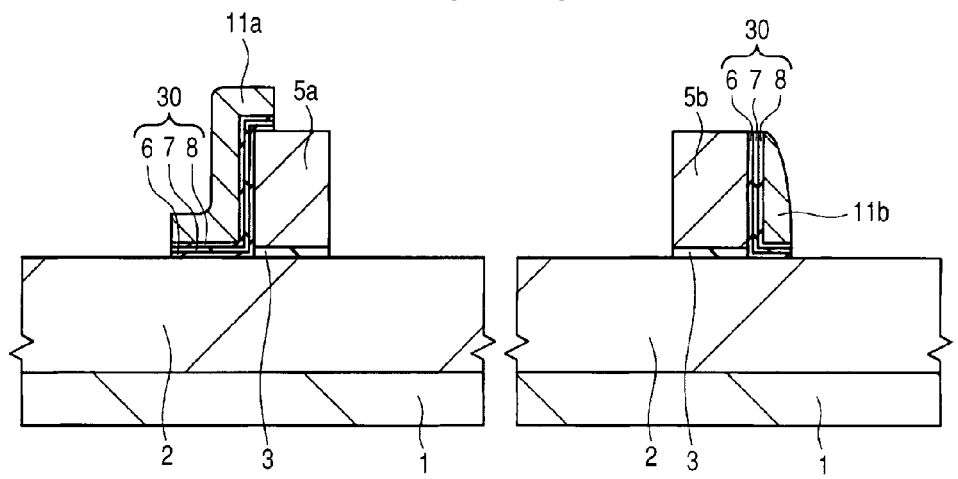
FIG. 25 is a sectional view of the substantial part showing the production method of the semiconductor device in succession to FIG. 24.

Successively, as shown in FIG. 25, a photoresist film (not shown in the figure) is formed over the main face of the silicon substrate 1. Thereafter, the polycrystalline silicon film 9 on one side of each of the control gate electrodes 5a and 5b is removed by dry etching, a part of the triple-layered insulation film comprising the bottom oxide film 6, the silicon nitride film 7, and the top oxide film 8 configuring the gate insulation film is removed by etching with hydrofluoric acid and phosphoric acid, and thereafter the photoresist film is removed.

Figure 26:
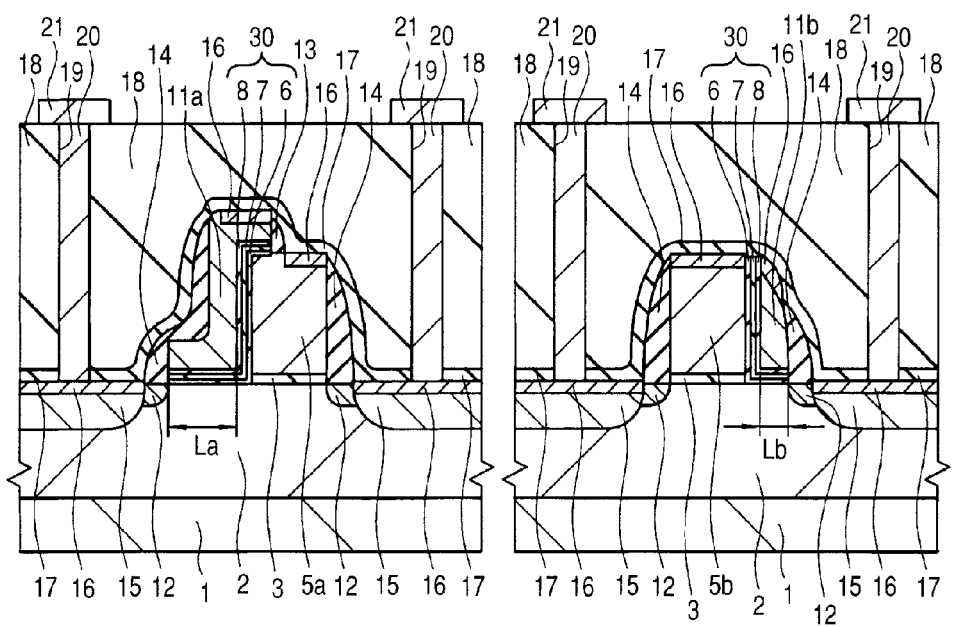
FIG. 26 is a sectional view of the substantial part showing the production method of the semiconductor device in succession to FIG. 25.

The succeeding process steps are applied as shown in FIG. 26 in the same way as Embodiment 1. That is, an n⁻-type semiconductor region 12 is formed in the p-type well 2, sidewalls 14 comprising a silicon oxide film 13 are formed, and an n⁺-type semiconductor region 15 is formed in the p-type well 2. Thereafter, the surfaces of the control gate electrodes 5a and 5b, the memory gate electrodes 11a and 11b, and the n⁺-type semiconductor region 15 are silicified, a cobalt silicide film 16 is formed, an etching stopper film 17, an interlayer insulation film 18, contact holes 19, contact plugs 20, and wires 21 are formed, and thereby split gate type memories of a MONOS type are completed. As a silicide film, a nickel silicide film, a titanium silicide film, or a platinum silicide film may be formed.

Here, the gate length La is set so as to be longer than the gate length Lb since the silicon oxide film 10 is covered with the photoresist film 22 when the silicon oxide film is etched and, in the present embodiment, it comes to be possible to jointly loading memories having plural kinds of performance conforming to the intended uses in an identical chip by forming split gate type memories containing memory gate electrodes having gate lengths different from each other. Further, it comes to be possible to selectively produce memory gate electrodes having gate lengths different from each other easily and with a high degree of accuracy by inhibiting the number of process steps from increasing and using a self-aligning technology.

Embodiment 4

Embodiment 4 is a modified example that makes it possible to jointly loading memories having plural kinds of performance conforming to intended uses in an identical chip in comparison with Example 1 stated earlier.

Figure 27:
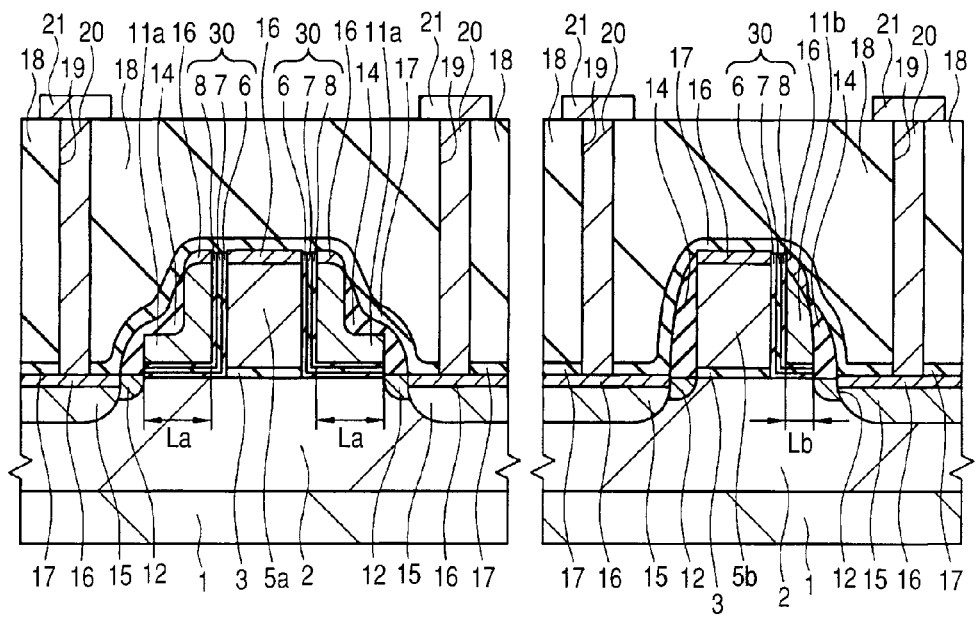
FIG. 27 is a sectional view showing a substantial part of a semiconductor device studied by the present inventors.
Figure 28:
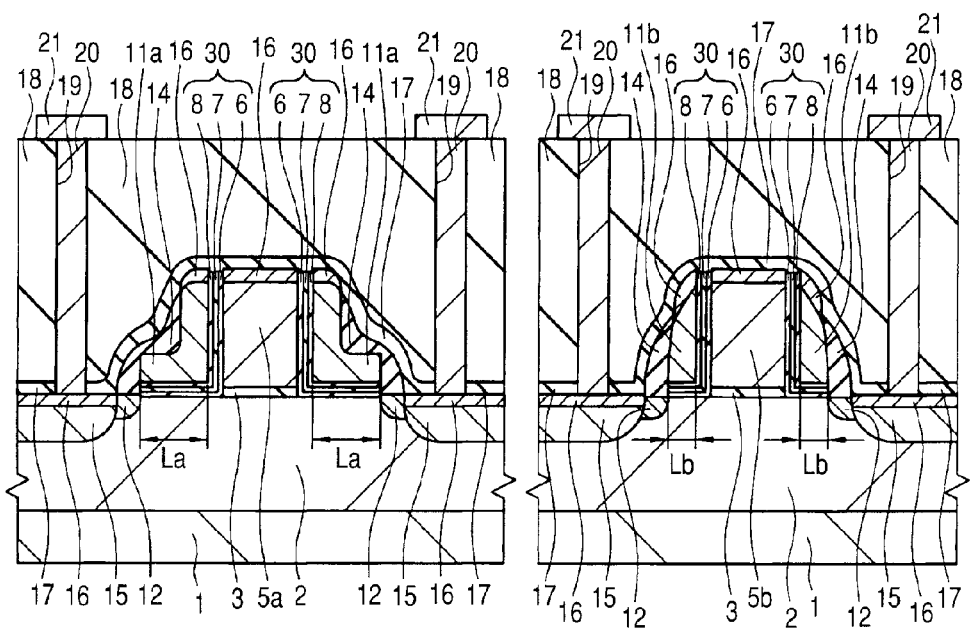
FIG. 28 is a sectional view showing a substantial part of a semiconductor device studied by the present inventors.

Whereas the memory gate electrodes 11a and 11b are formed only over the sidewalls on one side of the control gate electrodes 5a and 5b in Embodiment 1, in Embodiment 4 as shown in FIG. 27, memory gate electrodes 11a are formed over both the sidewalls of the control gate electrode 5a and a memory gate electrode 11b is formed over the sidewall on one side of the control gate electrode 5b. Otherwise as shown in FIG. 28, the memory gate electrodes 11a and 11b are formed over both the sidewalls of the control gate electrodes 5a and 5b respectively.

In Embodiment 4, in the same way as Embodiment 1, the gate length La of each of the memory gate electrodes 11a is longer than the gate length Lb of the memory gate electrode 11b. A memory MIS transistor including the memory gate electrodes 11a: has a gate length La identical to or longer than the gate length of the control gate electrode 5a; thus has h wide range for accumulating electric charge; hence has high memory reliability; and is used mainly for storing data. A memory MIS transistor including the memory gate electrode 11b: has a gate length Lb shorter than the gate length of the control gate electrode 5b; thus can reduce the memory cell area; can increase the speed of erasing electric charge and the speed of read operation; and hence is used mainly for programs.

A method for producing nonvolatile memories according to the present embodiment is explained hereunder. The method can be applied in the same way as the production method according to Embodiment 1 stated earlier except the following points.

Firstly, the case of the memory cells in FIG. 27 is explained. In the step of removing the polycrystalline silicon film 9 on one side of the control gate electrodes 5a and 5b by dry etching as it has been explained in reference to FIG. 10, the etching is applied to the polycrystalline silicon film 9 on one side of the control gate electrode 5b. In contrast, in the case of the memory cells in FIG. 27, the etching is not applied by forming a photoresist film in the vicinities of the control gate electrode 5a and the polycrystalline silicon film 9 formed over both the sidewalls thereof. As a result, memory cells having a structure in which the memory gate electrodes 11a remain over both the sidewalls of the control gate electrode 5a and the memory gate electrode 11b is formed only over the sidewall on one side of the control gate electrode 5b can be obtained.

Further, in the case of the memory cells in FIG. 28, the step of removing the polycrystalline silicon film 9 on one side of the control gate electrodes 5a and 5b by dry etching as it has been explained in reference to FIG. 10 is not applied. As a result, memory cells having a structure in which the memory gate electrodes 11a and 11b are formed over both the sidewalls of the control gate electrodes 5a and 5b respectively can be produced.

In this way in Embodiment 4, by forming the memory gate electrodes 11a over both the sidewalls of the single control gate electrode 5a, it is possible to store two-valued data in the single memory cell and hence reduce the region where the memory cell used for storing data is formed. Further, in the case of forming the memory gate electrodes 11b also over both the sidewalls of the control gate electrode 5b, it is possible to further reduce the region where the memory cell used for programs is formed.

In Embodiment 4 further, in the same way as Embodiment 2, it is also possible to obtain a structure in which cobalt silicide is not formed in the region of the memory gate electrodes 11a and 11b where silicon oxide is formed by forming the silicon oxide film 13 between the control gate electrode 5a and the memory gate electrodes 11a and between the control gate electrode 5b and the memory gate electrode 11b (graphical illustration is omitted). On this occasion, it is possible to obtain the effects similar to Embodiment 2. That is, the distance between the cobalt silicide film 16 over the control gate electrode 5a and the cobalt silicide film 16 over the memory gate electrodes 11a increases. As a result, it comes to be possible to reduce the probability of short-circuit generated between the cobalt silicide film 16 over the control gate electrode 5a and the cobalt silicide film 16 over the memory gate electrodes 11a. Further, the distance between the cobalt silicide film 16 over the control gate electrode 5b and the cobalt silicide film 16 over the memory gate electrode 11b increases. As a result, it comes to be possible to reduce the probability of short-circuit generated between the cobalt silicide film 16 over the control gate electrode 5b and the cobalt silicide film 16 over the memory gate electrode 11b.

In Embodiment 4 furthermore, besides the above production method, it is also possible to apply etching to the polycrystalline silicon film 9 with a photoresist film in the same way as Embodiment 3 when the memory gate electrodes 11a are formed over the sidewalls of the control gate electrode 5a. On this occasion, in the step of Embodiment 3 explained in reference to FIG. 23, a photoresist film 22 is formed so that the vicinities on both the sides of the control gate electrode 5a may be covered and etching is applied to the polycrystalline silicon film 9 (graphical illustration is omitted). In this case too, the gate length La is set so as to be longer than the gate length Lb since the control gate electrode 5a is covered with the photoresist film 22 when the silicon oxide film 10 is etched and it comes to be possible to jointly loading memories having plural kinds of performance conforming to the intended uses in an identical chip by forming split gate type memories containing memory gate electrodes having gate lengths different from each other. Further, it comes to be possible to selectively produce memory gate electrodes having gate lengths different from each other easily with a high degree of accuracy by inhibiting the number of process steps from increasing and using a self-aligning technology.

The invention established by the present inventors is hereinbefore explained concretely on the basis of embodiments but it goes without saying that the present invention is not limited to the embodiments and can be variously modified in the range not deviating from the gist of the present invention.

A method for producing a semiconductor device according to the present invention is widely used for a nonvolatile memory mountable on a microcomputer.

What is claimed is:

1. A method for producing a semiconductor device including a first memory cell having a first control gate electrode and a first memory gate electrode and a second memory cell having a second control gate electrode and a second memory gate electrode, the first and second memory cells being formed over the main face of a semiconductor substrate, the method comprising the steps of:
  (a) forming a well of a first conductivity type over the semiconductor substrate;
  (b) forming a first gate insulation film over the well;
  (c) forming the first and second control gate electrodes over the first gate insulation film;
  (d) after the step (c), forming a second gate insulation film over the main face of the semiconductor substrate;
  (e) after the step (d), forming a conductive film over the main face of the semiconductor substrate;
  (f) after the step (e), forming a first insulation film over the main face of the semiconductor substrate;
  (g) patterning the first insulation film in the manner of covering the first control gate electrode and the vicinity thereof;
  (h) after the step (g), forming a sidewall comprised of the first insulation film by anisotropic etching over the side face of the conductive film with which the sidewall of the first control gate electrode is covered;

(i) after the step (h), forming the first and second memory gate electrodes over both the sidewalls of the first and second control gate electrodes by patterning the conductive film formed over the second gate insulation film;

(j) after the step (i), removing the sidewall;

(k) after the step (j), removing one of the first and second memory gate electrodes formed over both the sidewalls of each of the first and second control gate electrodes;

(l) after the step (k), leaving the second gate insulation film between the sidewalls of the first and second control gate electrodes and the first and second memory gate electrodes and between the well and the first and second memory gate electrodes by patterning the second gate insulation film; and (m) after the step (l), forming source and drain regions of a second conductivity type functioning as the conductivity type opposite to the first conductivity type of the first and second memory cells respectively in the well, wherein the first memory gate electrode is formed so as to have a gate length longer than the gate length of the second memory gate electrode.

2. A method for producing a semiconductor device according to claim 1, wherein, in the step (i), the height of the top face of the memory gate electrode in each of the first and second memory cells is lower than the height of the top face of the control gate electrode in each of the first and second memory cells.

3. A method for producing a semiconductor device according to claim 2, further comprising, after the step (m), the steps of:

(n) covering parts of the top faces of the first and second memory gate electrodes with a second insulation film formed in the shape of a sidewall over the side faces of the first and second control gate electrodes; and (o) forming silicide over the upper parts of the control gate electrodes, the regions of the upper parts of the memory gate electrodes not covered with the second insulation film, the source regions, and the drain regions, respectively.

4. A method for producing a semiconductor device according to claim 1, wherein the first memory cell is used for storing data and the second memory cell is used for programs.

5. A method for producing a semiconductor device according to claim 1, wherein, in the step (i), the second memory gate electrode is formed in the shape of a sidewall over a sidewall of the second control gate electrode.

6. A method for producing a semiconductor device according to claim 1, wherein the step (d) of forming the second gate insulation film includes the steps of:

(d1) after the step (c), forming a first potential barrier film over the semiconductor substrate;

(d2) forming a charge retention film over the first potential barrier film; and (d3) forming a second potential barrier film over the charge retention film.

7. A method for producing a semiconductor device according to claim 1, wherein, in the step (k), the first memory gate electrode is not removed and is left over both the sidewalls of the first control gate electrode and the second memory gate electrode over the sidewall on one side of the second control gate electrode is removed.

8. A method for producing a semiconductor device according to claim 1, wherein, in the step (k), the first and second memory gate electrodes are not removed and are left over both the sidewalls of the first and second control gate electrodes.

9. A method for producing a semiconductor device including a first memory cell having a first control gate electrode and a first memory gate electrode and a second memory cell having a second control gate electrode and a second memory gate electrode, the first and second memory cells being formed over the main face of a semiconductor substrate, the method comprising the steps of:

(a) forming a well of a first conductivity type over the semiconductor substrate;

(b) forming a first gate insulation film over the well;

(c) forming the first and second control gate electrodes through the first gate insulation film;

(d) after the step (c), forming a second gate insulation film over the main face of the semiconductor substrate;

(e) after the step (d), forming a conductive film over the main face of the semiconductor substrate;

(f) after the step (e), covering the region ranging from a part of the top face of the first control gate electrode to the region ranging from a sidewall on one side of the first control gate electrode to the semiconductor substrate in the vicinity of the first control gate electrode with a photoresist;

(g) after the step (f), by patterning the conductive film formed over the second gate insulation film, forming the first memory gate electrode comprised of the conductive film over a side face of one side of the first control gate electrode, forming a side wall comprised of the conductive film over the sidewall on the other side of the first control gate electrode at the lower part of the photoresist, forming a second memory gate electrode over both the sidewalls of the second control gate electrode, and thereafter removing the photoresist;

(h) after the step (g), removing the sidewall and the second memory gate electrode over the sidewall on one side of the second control gate electrode;

(i) after the step (h), leaving the second gate insulation film between the sidewalls of the first and second control gate electrodes and the first and second memory gate electrodes and between the semiconductor substrate and the first and second memory gate electrodes by patterning the second gate insulation film; and (j) after the step (i), forming source and drain regions of a second conductivity type functioning as the conductivity type opposite to the first conductivity type of the first and second memory cells in the well, respectively, wherein the first memory gate electrode is formed so as to have a gate length longer than the gate length of the second memory gate electrode.

10. A method for producing a semiconductor device according to claim 9, wherein the first memory cell is used for storing data and the second memory cell is used for programs.

11. A method for producing a semiconductor device according to claim 9, wherein the step (d) of forming the second gate insulation film includes the steps of:

(d1) after the step (c), forming a first potential barrier film over the semiconductor substrate;

(d2) forming a charge retention film over the first potential barrier film; and (d3) forming a second potential barrier film over the charge retention film.

12. A method for producing a semiconductor device according to claim 9,
- wherein, in the step (f), the photoresist formed over a sidewall on one side of the first control gate electrode is formed also over a sidewall on another side likewise,
- wherein in the step (g), the first and second memory gate electrodes are formed over both the sidewalls of the first and second control gate electrodes, and,
- wherein, in the step (h), the first memory gate electrode is not removed and is left over both the sidewalls of the first control gate electrode and the second memory gate electrode over the sidewall on one side of the second control gate electrode is removed.

13. A method for producing a semiconductor device according to claim 9,
- wherein, in the step (f), the photoresist formed over a sidewall on one side of the first control gate electrode is formed also over a sidewall on another side likewise,
- wherein in the step (g), the first and second memory gate electrodes are formed over both the sidewalls of the first and second control gate electrodes, and,
- wherein in the step (h), the first and second memory gate electrodes are not removed and are left over both the sidewalls of the first and second control gate electrodes.

* * * * *